US008975905B2

(12) United States Patent
Kim et al.

(10) Patent No.: US 8,975,905 B2
(45) Date of Patent: Mar. 10, 2015

(54) DISPLAY APPARATUS WITH REDUCED NUMBER OF TEST LINES FOR ARRAY TEST PROCESS AND METHOD OF TESTING THE SAME

(75) Inventors: EunJu Kim, Cheongan-si (KR); Bonyong Koo, Cheonan-si (KR); Dong-Yoon Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 246 days.

(21) Appl. No.: 13/608,223

(22) Filed: Sep. 10, 2012

(65) Prior Publication Data

US 2013/0265072 A1 Oct. 10, 2013

(30) Foreign Application Priority Data

Apr. 10, 2012 (KR) ........................ 10-2012-0037506

(51) Int. Cl.
*G01R 31/26* (2014.01)

(52) U.S. Cl.
USPC ................................ 324/754.01; 324/760.01

(58) Field of Classification Search
CPC ....... H05K 7/00; G09G 3/006; G02F 1/13458
See application file for complete search history.

(56) References Cited

U.S. PATENT DOCUMENTS 6,686,224 B2 2/2004 Higashi
7,336,093 B2 * 2/2008 Uei et al. ................. 324/760.01
7,388,641 B2 6/2008 Kim
7,466,158 B2 12/2008 Hirose
7,675,600 B2 3/2010 Jeoung et al.
7,944,225 B2 5/2011 Kemmerling
2004/0119925 A1 * 6/2004 Moon .......................... 349/139
2009/0294771 A1 * 12/2009 Kim et al. ...................... 257/59
2010/0141293 A1 * 6/2010 Chen et al. .................... 324/770
2012/0025855 A1 * 2/2012 Chang et al. ............... 324/750.3

FOREIGN PATENT DOCUMENTS

JP 06-180460 A 6/1994
JP 2002-289658 A 10/2002
JP 2010-101776 A 5/2010
KR 10-0692691 B1 3/2007
KR 1020070071341 A 7/2007
KR 10-0911467 B1 8/2009

* cited by examiner

*Primary Examiner* — Minh N Tang
(74) *Attorney, Agent, or Firm* — Cantor Colburn LLP

(57) ABSTRACT

A display apparatus includes a display panel including a plurality of pixels, a plurality of first lines and a plurality of second lines, a plurality of first pads electrically connected to the first lines, respectively, where the first pads are divided into a first group and a second group, a plurality of pads including a second pad, a third pad, a fourth pad and a fifth pad, a first shorting bar configured to be connected to the first group of the first pads and to be connected between the second pad and the fourth pad during a test process of the first lines, and a second shorting bar configured to be connected to the second group of the first pads and to be connected between the third pad and the fifth pad during the test process of the first lines.

14 Claims, 3 Drawing Sheets

DISPLAY APPARATUS WITH REDUCED NUMBER OF TEST LINES FOR ARRAY TEST PROCESS AND METHOD OF TESTING THE SAME

This application claims priority to Korean Patent Application No. 10-2012-0037506, filed on Apr. 10, 2012, and all the benefits accruing therefrom under 35 U.S.C. §119, the content of which in its entirety is herein incorporated by reference.

BACKGROUND

1. Field

The present disclosure relates to a display apparatus and a method of testing the display apparatus.

2. Description of the Related Art

In recent, as a flat panel display device, e.g., a liquid crystal display, a plasma display panel, an organic electroluminescence display, a field effect display, an electrophoretic display and an electrowetting display, are extensively used.

The flat panel display devices are used in various electric appliances, such as a television set, a computer monitor, for example, to display images and text. Particularly, an active matrix liquid crystal display, which drives a liquid crystal cell using a thin film transistor, has high image display quality and low power consumption.

A process of manufacturing the active matrix liquid crystal display typically includes a substrate cleaning process, a substrate patterning process, an alignment layer forming process, a rubbing process, a substrate coupling process, a liquid crystal injecting process, an inspecting process, a repair process and a mounting process, for example.

In the inspecting process of the liquid crystal display, an array test process is performed to inspect whether a gate or data line of the liquid crystal display normally operate. The gate or data line including a metal material may be opened or shorted by a step difference between layers disposed thereunder or particles generated in an exposure process.

The array test process is generally performed to manufacture the liquid crystal display, but, additional lines for testing the gate or data line are generally prepared and used. Due to the additional test lines, narrowing the width of the periphery around a viewing area (e.g., bezel) of the liquid crystal display may be limited.

SUMMARY

The present disclosure provides a display apparatus including a display panel which is tested without providing additional test lines thereon.

The present disclosure provides a method of testing the display apparatus.

In an exemplary embodiment, a display apparatus includes a display panel including a plurality of pixels, a plurality of first lines and a plurality of second lines, a plurality of first pads electrically connected to the first lines, respectively, where the first pads are divided into a first group and a second group, a plurality of pads including a second pad, a third pad, a fourth pad and a fifth pad, a first shorting bar configured to be connected to the first group of the first pads and to be connected between the second pad and the fourth pad during a test process of the first lines, and a second shorting bar configured to be connected to the second group of the first pads and to be connected between the third pad and the fifth pad during the test process of the first lines.

In an exemplary embodiment, the array substrate may include a display area and a non-display area, where the pixels are arranged in the display area.

In an exemplary embodiment, the first pads, the first and second shorting bars, and the second to fifth pads are arranged in the non-display area of the display panel.

In an exemplary embodiment, the display apparatus may further include a first probe pad configured to be electrically connected to the fourth pad during the test process for the first lines, wherein the first probe pad receives a first test signal, and a second probe pad configured to be electrically connected to the fifth pad during the test process for the first lines, wherein the second probe pad receives a second test signal.

In an exemplary embodiment, the display apparatus may further include a driver integrated circuit ("IC") including a plurality of chip pads, where the driver IC drives the first lines, and the first to fifth pads are connected to the chip pads of the driver IC.

In an exemplary embodiment, the first and second shorting bars may be arranged in a driver IC area of the display panel, in which the driver IC is disposed.

In an exemplary embodiment, the second and fourth pads may be disconnected from the first shorting bar after the test process of the first lines, and the third and fifth pads may be disconnected from the second shorting bar after the test process of the first lines.

In an exemplary embodiment, the first pads are disconnected from the first shorting bar and the second shorting bar after the test process of the first lines In an exemplary embodiment, the first lines may be gate lines, and the second lines may be data lines.

In an exemplary embodiment, the second and fourth pads receive or transmit a vertical synchronization start signal, and the third and fifth pads receive or transmit a clock signal.

In an exemplary embodiment, a method of testing a display apparatus including a display panel including a plurality of pixels, a plurality of gate lines and a plurality of data lines includes: applying a first test signal to a first shorting bar on the display panel, where the first shorting bar is provided between a second pad and a fourth pad on the display panel and connected to a first group of a plurality of first pads, which is connected to the gate lines, respectively; applying a second test signal to a second shorting bar on the display panel, where the second shorting bar is provided between a third pad and a fifth pad on the display panel and connected to a second group of the first pads; determining whether a defect occurs in the gate lines through a first probe pad electrically connected to the fourth pad and through a second probe pad electrically connected to the fifth pad; and electrically disconnecting the first and second shorting bars from the first to fifth pads.

In an exemplary embodiment, the first to fifth pads are connected to chip pads in a gate driver IC that drives the gate lines.

In an exemplary embodiment, the second and fourth pads may receive or transmit a vertical synchronization start signal, and the third and fifth pads may receive or transmit a clock signal.

In an exemplary embodiment, the method may further include electrically disconnecting the first and second shorting bars from the first pads.

According to exemplary embodiments, the number of the test lines for the array test is reduced or effectively minimized, and thus the width of the non-display area of the display panel is reduced.

BRIEF DESCRIPTION OF THE DRAWINGS

The above and other features of the invention will become readily apparent by reference to the following detailed description when considered in conjunction with the accompanying drawings wherein.

DETAILED DESCRIPTION

Figure 1:
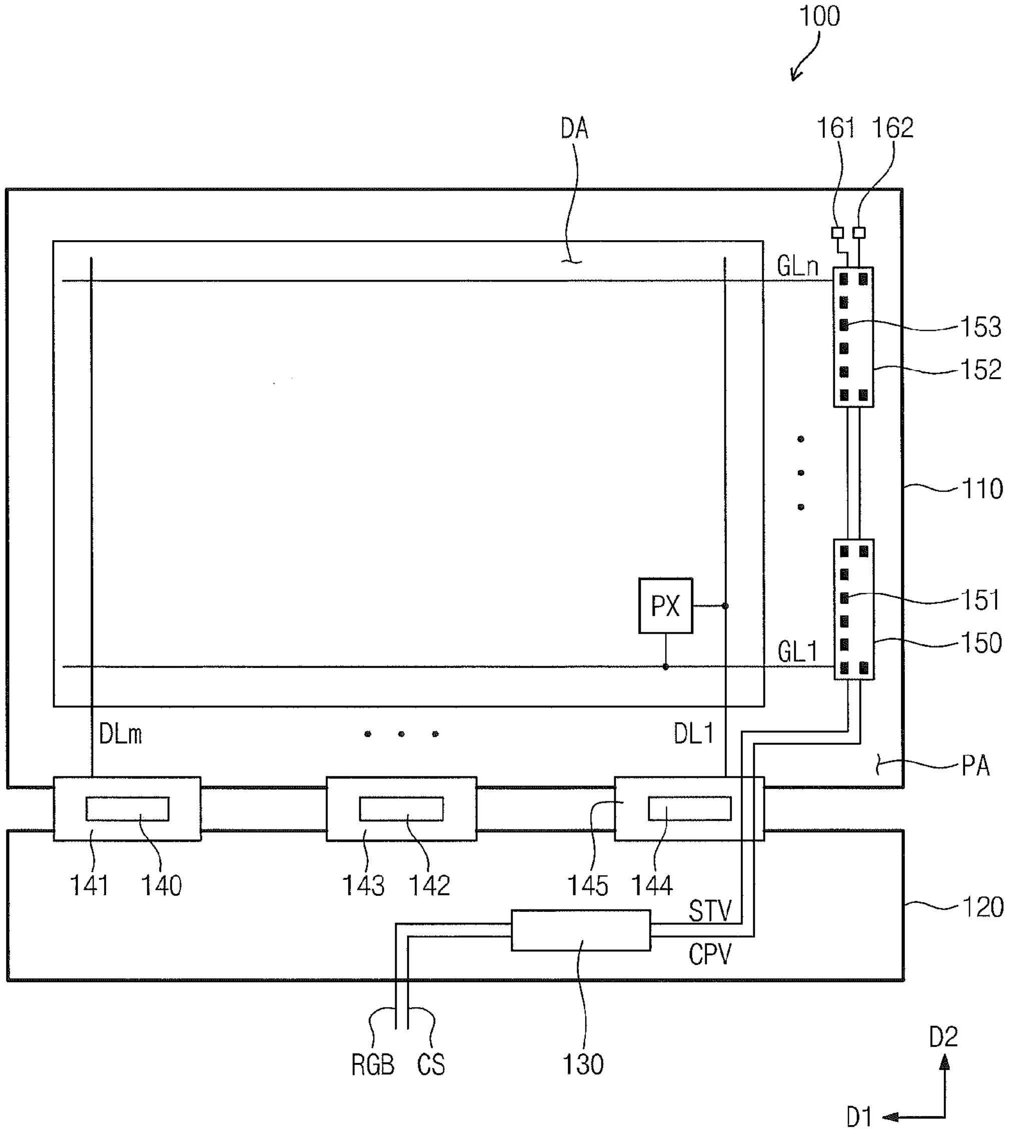
FIG. 1 is a plan view of an exemplary embodiment of a display apparatus according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in detail with reference to the accompanying drawings.

FIG. 1 is a plan view of an exemplary embodiment of a display apparatus according to the invention.

Referring to FIG. 1, the display apparatus 100 includes a display panel 110, a printed circuit board 120, a timing controller 130, data driver integrated circuits ("IC"s), e.g., a first data driver IC 140, a second data driver IC 142 and a third data driver IC 144, gate driver ICs, e.g., a first gate driver IC 150 and a second gate driver IC 152, and probe pads, e.g., a first probe pad 161 and a second probe pad 162.

The display panel 110 displays an image. In an exemplary embodiment, the display panel 110 may be one of various display panels, such as a liquid crystal display panel, an organic light emitting display panel, an electrophoretic display panel, and an electrowetting display panel, for example.

In an exemplary embodiment, the display panel 110 is a liquid crystal display panel. In such an embodiment, the display apparatus 100 may further include a backlight unit (not shown) disposed adjacent to the display panel 110 to provide light to the display panel 110. The backlight unit may include a plurality of visible light sources for providing visible light and a plurality of infrared light sources for providing infrared light.

The display panel 110 is divided into a display area DA including a plurality of pixels PX and a peripheral area PA surrounding the display area DA. The display area DA is an area where an image is displayed, and the peripheral area PA is an area where no image is displayed.

The display panel 110 includes a plurality of gate lines, e.g., first to n-th gate lines GL1 to GLn, extending in a first direction D1 and a plurality of data lines, e.g., first to m-th data lines DL1 to DLm, extending in a second direction D2. Here, n and m are natural numbers. The data lines DL1 to DLm are insulated from the gate lines GL1 to GLn while crossing the gate lines GL1 to GLn. The gate lines GL1 to GLn are connected to the gate driver ICs 150 and 152, and the data lines DL1 to DLm are connected to the data driver ICs 140, 142 and 144.

In an exemplary embodiment, each pixel PX includes a switching transistor (not shown) connected to a corresponding gate line of the gate lines GL1 to GLn and a corresponding data line of the data lines DL1 to DLm, and a liquid crystal capacitor (not shown) and a storage capacitor (not shown), which are connected to the switching transistor.

The data driver ICs 140, 142 and 144 are disposed, e.g., mounted, on flexible printed circuit boards 141, 143 and 145, respectively. In an exemplary embodiment, the flexible printed circuit boards 141, 143 and 145 are disposed between and connected to a side portion of the peripheral area PA of the display panel 110 and the printed circuit board by a tape automated bonding ("TAP") method. In an exemplary embodiment, the gate driver ICs 150 and 152 are attached to another side portion of the peripheral area PA by a chip-on-glass ("COG") method.

In FIG. 1, three data driver ICs 140, 142 and 144 and two gate driver ICs 150 and 152 have been shown, but not being limited thereto. In an alternative exemplary embodiment, the numbers of the data driver ICs and the gate driver ICs may be changed in various ways.

The timing controller 130 is disposed, e.g., mounted, on the printed circuit board 120. The timing controller receives an image signal RGB and a control signal CS from an external source (not shown). In an exemplary embodiment, the timing controller 130 converts a data format of the image signal RGB to a data format corresponding to an interface between the timing controller 130 and the data driver ICs 140, 142 and 144 and provides the converted image signal to the data driver ICs 140, 142 and 144. In such an embodiment, the timing controller 130 provides a data control signal, e.g., an output start signal, a horizontal start signal and a polarity inversion signal, to the data driver ICs 140, 142 and 144. The data driver ICs 140, 142 and 144 convert the image signal to data voltages and output the data voltages to the data lines DL1 to DLm in response to the data control signal.

The timing controller 130 provides a vertical synchronization start signal STV and a clock signal CPV to the gate driver IC 150. The vertical synchronization start signal STV and the clock signal CPV provided from the timing controller 130 to the gate driver IC 150 may be applied to the gate driver ICs 150 and 152 via the flexible printed circuit board 145. The gate driver ICs 150 and 152 sequentially drives the gate lines GL1 to GLn in response to the vertical synchronization start signal STV and the clock signal CPV from the timing controller 130. The first and second probe pads 161 and 162 will be described later in detail.

Figure 2:
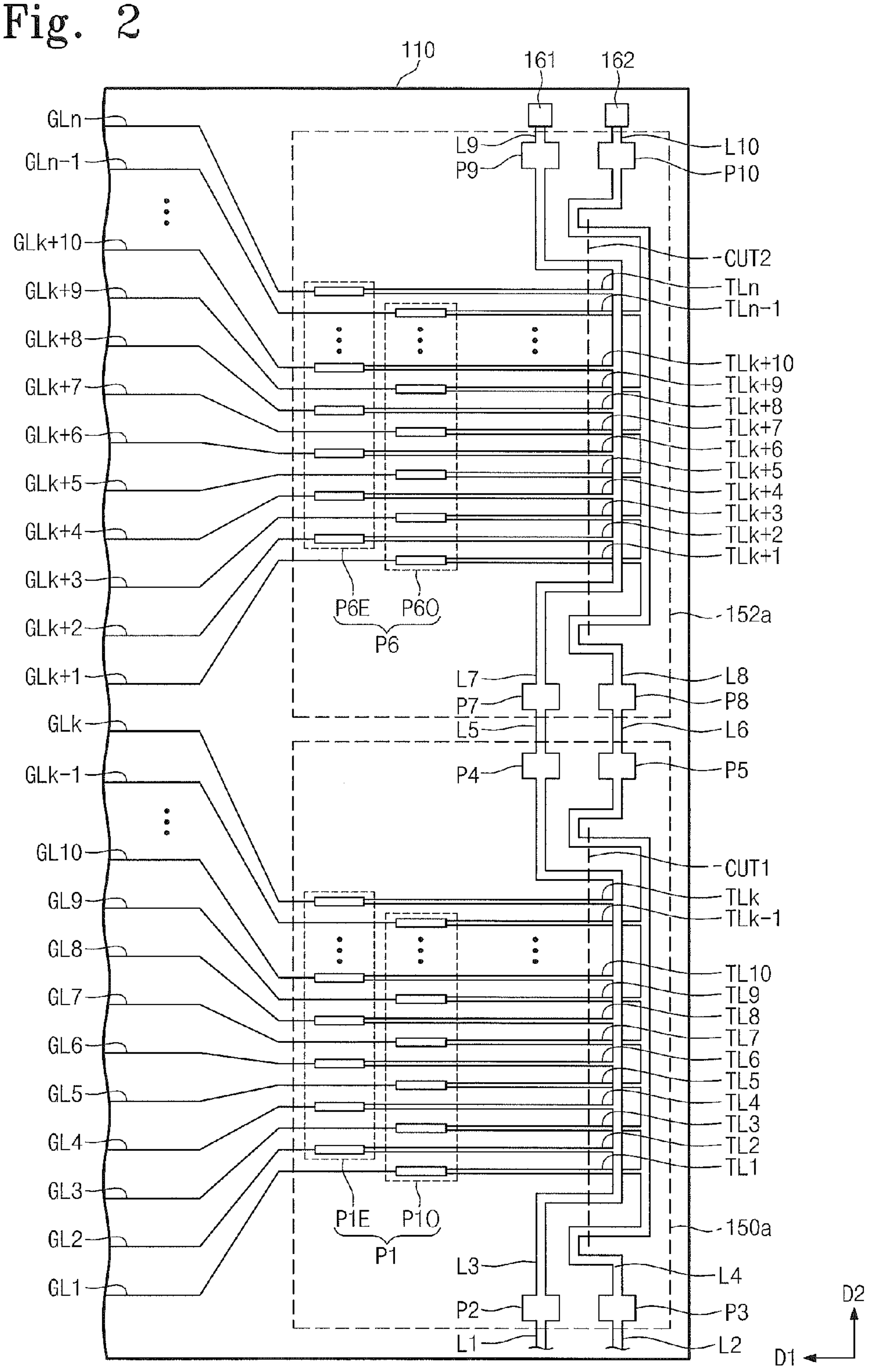
FIG. 2 is an enlarged plan view of a portion of a display panel shown in FIG. 1 for an array test.

FIG. 2 is an enlarged plan view of a portion of the display panel of FIG. 1 for an array test.

FIG. 2 shows a portion of the display panel 110 before the gate driver ICs 150 and 152 are provided thereon. A first gate IC area 150*a* represents an area on which the first gate driver IC 150 is mounted by the COG method, and a second gate IC area 152*a* represents an area on which the second gate driver IC 152 is mounted by the COG method.

The display panel 110 includes a plurality of first pads P1, a second pad P2, a third pad P3, a fourth pad P4 and a fifth pad P5, which are connected to the first gate driver IC 150 shown in FIG. 1, and the display panel 110 includes a plurality of sixth pads P6, a seventh pad P7, an eighth pad P8, a ninth pad P9 and a tenth pad P10, which are connected to the second gate driver IC 152 shown in FIG. 1.

The first pads P1 are pads (or bumps) to electrically connect the gate driver IC 150 shown in FIG. 1 and a portion of the gate lines, e.g., the first to k-th gate liens GL1 to GLk, arranged in the display panel 110. Here, k is a number greater than zero (0) and less than n. The second and third pads P2 and P3 are pads to apply the vertical synchronization start signal STV and the clock signal CPV from the timing controller 130 to the gate driver IC 150. The second pad P2 is connected to a first line L1 that transmits the vertical synchronization start signal STV from the timing controller 130 shown in FIG. 1. The third pad P3 is connected to a second line L2 that transmits the clock signal CPV from the timing controller 130 shown in FIG. 1. The fourth and fifth pads P4 and P5 are pads to apply output signals from the gate driver IC 150 to the gate driver IC 152. The second pad P2 is connected to the fourth pad P4 through a third line L3, and the third pad P3 is connected to the fifth pad P5 through a fourth line L4. After an array test process, the first to fifth pads P1 to P5 are connected to chip pads 151 in the first gate driver IC 150 shown in FIG. 1.

The sixth pads P6 are pads to electrically connect the second gate driver IC 152 shown in FIG. 1 and a portion of the gate lines, e.g., the (k+1)-th to n-th gate lines GLk+1 to GLn, arranged in the display panel 110. The seventh and eighth pads P7 and P8 are pads to apply the signals from the fourth and fifth pads P4 and P5 to the gate driver IC 152. The ninth and tenth pads P9 and P10 are pads to output the signals from the gate driver IC 152. The seventh pad P7 is connected to the ninth pad P9 through a seventh line L7, and the eighth pad P8 is connected to the tenth pad P10 through an eighth line L8. The first probe pad 161 is connected to the ninth pad P9 through a ninth line L9, and the second probe pad 162 is connected to the tenth pad P10 through a tenth line L10. In an alternative exemplary embodiment, where only the first gate driver IC 150 is mounted on the display panel 110, the first probe pad 161 is connected to the fourth pad P4 through a fifth line L5 and the second probe pad 162 is connected to the fifth pad P5 through a sixth line L6. In an exemplary embodiment, where three or more gate driver ICs are mounted on the display panel 110, the gate driver ICs are connected to each other in series in a way shown in FIG. 2. After the array test process, the sixth to tenth pads P6 to P10 are connected to chip pads 153 in the second gate driver IC 152 shown in FIG. 1.

In an exemplary embodiment of a liquid crystal display to which the COG method is applied, the first and sixth pads P1 and P6 have a size smaller than a probe pin that is used as an inspection tool, and a direct inspection using the probe pin may not be available. In such an embodiment, the gate lines GL1 to GLn are divided into odd-numbered gate lines to be connected to each other and even-numbered gate lines to be connected to each other through test lines, e.g., first to n-th test lines TL1 to TLn, and the first and second probe pads 161 and 162 are formed to be connected to the odd-numbered gate lines and the even numbered gate lines, respectively, thereby detecting a defect in the liquid crystal display panel 110.

According to an exemplary embodiment, a probe may directly contact the first to tenth pads P1 to P10 connected to the gate lines GL1 to GLn to apply a test signal instead of using additional test pads, e.g., the first and second probe pads 161 and 162.

The first pads P1 are divided into two groups, e.g., a first group and a second group. Pads P10 in the first group of the first pads P1 are connected to the odd-numbered gate lines of the gate lines connected to the first pads P1, e.g., the first gate line GL1, the third gate line GL3, . . . , the (k−1)-th gate line GLk−1, and pads HE in the second group of the first pads P1 are connected to the even-numbered gate lines of the gate lines connected to the first pads P1, e.g., the second gate line GL2, the fourth gate line GL4, . . . , the k-th gate line GLk. The pads P10 in the first group of the first pads P1 are connected to the fourth line L4 through a first portion of the test lines, e.g., odd-numbered test lines including the first test line TL1, the third test line TL3, . . . , the (k−1)-th test line TLk−1, and the pads P1E in the second group of the first pads P1 are connected to the third line L3 through a second portion of the test lines, e.g., even-numbered test lines including the second test line TL2, the fourth test line TL4, . . . , the k-th test line TLk.

The third and fourth lines L3 and L4 serve as shorting bars that are connected to the first to k-th gate lines GL1 to GLk arranged in the first gate IC area 150*a* of the display panel 110 for the array test process. The third line L3 and the fourth line L4 are arranged substantially parallel to each other with a uniform distance therebetween.

After the array test, the first and second test lines TL1 to TLk are disconnected from the shorting bars (i.e., the third line L3 and the fourth line L4) by a laser trimming process for normal driving of the display panel 110. As shown in FIG. 2, the test lines connected to the gate lines in the first gate IC area 150*a*, e.g., the first to k-th test lines TL1 to TLk, are disconnected from the third and fourth lines L3 and L4 along a first cutting line CUT1 elongated in the second direction D2. Thus, the even-numbered gate lines in the first gate IC area 150*a*, e.g., the second gate line GL2, the fourth gate line GL4, . . . , the k-th gate line GLk, are electrically separated from each other, and the odd-numbered gate lines in the first gate IC area 150*a*, e.g., the first gate line GL1, the third gate line GL3, . . . , the (k−1)-th gate line GLk−1, are electrically separated from each other. In such an embodiment, the second pad P2 is electrically disconnected from the fourth pad P4, and the third pad P3 is electrically disconnected from the fifth pad P5.

Similarly, the seventh and eighth lines L7 and L8 serve as shorting bars that are connected to the gate lines in the second gate IC 152*a* area GLk+1 to GLn arranged in the display panel 110 for the array test. After the array test, the test lines connected to the gate lines in the second gate IC area 152*a*, e.g., the (k+1)-th to n-th test lines TLk+1 to TLn, are disconnected from the shorting bars (e.g., the seventh line L7 and the eighth line L8) by the laser trimming process. As shown in FIG. 2, the test lines in the second gate IC area 152*a*, e.g., the (k+1)-th to n-th test lines TLk+1 to TLn, are disconnected from the seventh and eighth lines L7 and L8 along a second cutting line CUT2 elongated in the second direction D2. Thus, odd-numbered gate lines of the gate lines in the second gate IC area 152*a*, e.g., the (k+1)-th gate line GLk+1, the (k+3)-th gate line GLk+3, . . . , the (n−1)-th gate line GLn−1, are electrically separated from each other, and even-numbered gate lines of the gate lines in the second gate IC area 152, e.g., the (k+2)-th gate line GLk+2, the (k+4)-th gate line GLk+4, . . . , the n-th gate line GLn, are electrically separated from each other. In such an embodiment, the seventh pad P7 is electrically disconnected from the ninth pad P9, and the eighth pad P8 is electrically disconnected from the tenth pad P10.

In an exemplary embodiment, the third and fourth lines L3 and L4 used as the shorting bars are arranged in the first gate IC area 150*a* where the first gate driver IC 150 is disposed, and the seventh and eighth lines L7 and L8 are arranged in the second gate IC area 152*a* where the second gate driver IC 152 is disposed. In such an embodiment, a test line is not arranged outside the first gate IC area 150*a* where the first gate driver IC 150 is disposed, and thus a width of the peripheral area PA of the display panel 110 is substantially reduced or effectively minimized.

Figure 3:
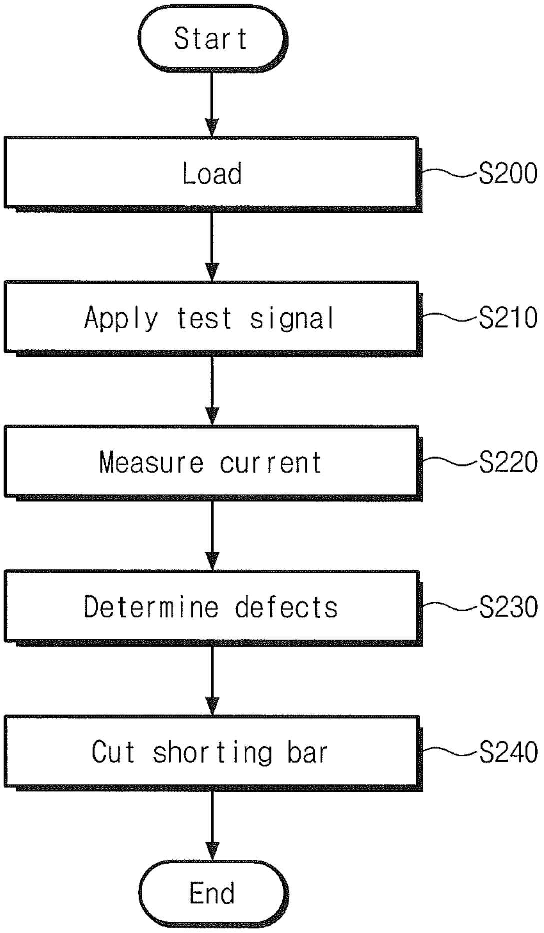
FIG. 3 is a flowchart explaining an exemplary embodiment of a method of testing a display apparatus according to the invention.

FIG. 3 is a flowchart explaining an exemplary embodiment of a test process of a display apparatus according to the invention.

Referring to FIG. 3, in an exemplary embodiment, the display panel 110 including the pixel PX, the gate lines GL1 to GLn, and the data lines DL1 to DLm is loaded onto a test device (not shown) (S200). In such an embodiment, as shown in FIG. 2, the first to tenth pads P1 to P10, the first and second probe pads 161 and 162, the test lines TL1 to TLn, and the first to tenth lines L1 to L10 are provided in the peripheral area PA of the display panel 110.

The test device applies the test signal to the first and second probe pads 161 and 162 (S210). After a predetermined time lapses, the test device measures a current flowing through the first and second probe pads 161 and 162 (S220). The test device determines whether a defect occurs in the display panel 110 or not based on the measured current (S230). When it is determined that no defect occurs in the display panel 110, the test lines TL1 to TLn are disconnected from the third, fourth, seventh, and eighth lines L3, L4, L7 and L8 along the first and second cutting lines CUT1 and CUT2 by the laser trimming process (240).

In such an embodiment, the number of lines used to test the gate lines GL1 to GLn is effectively minimized such that a production cost of the display apparatus is reduced.

Although only a few exemplary embodiments of the invention have been described herein, it is understood that the invention should not be limited to these exemplary embodiments but various changes and modifications can be made by one ordinary skilled in the art within the spirit and scope of the invention as hereinafter claimed.

What is claimed is:

1. A display apparatus comprising:

a display panel including a plurality of pixels, a plurality of first lines and a plurality of second lines;

a plurality of first pads electrically connected to the first lines, respectively, wherein the first pads are divided into a first group and a second group;

a plurality of pads including a second pad, a third pad, a fourth pad and a fifth pad;

a first shorting bar configured to be connected to the first group of the first pads and to be connected between the second pad and the fourth pad during an array test process of the first lines; and a second shorting bar configured to be connected to the second group of the first pads and to be connected between the third pad and the fifth pad during the array test process of the first lines, wherein the first and second shorting bars arranged in a driver integrated circuit area of the display panel, in which a driver integrated circuit is disposed.

2. The display apparatus of claim 1, wherein the display panel includes a display area and a non-display area, and the pixels are arranged in the display area.

3. The display apparatus of claim 2, wherein the first pads, the first and second shorting bars and the second to fifth pads are arranged in the non-display area of the display panel.

4. The display apparatus of claim 1, further comprising:

a first probe pad configured to be electrically connected to the fourth pad during the test process for the first lines, wherein the first probe pad receives a first test signal; and a second probe pad configured to be electrically connected to the fifth pad during the test process for the first lines, wherein the second probe pad receives a second test signal.

5. The display apparatus of claim 1, further comprising:

the driver integrated circuit including a plurality of chip pads, wherein the driver integrated circuit drives the first lines, and wherein the first to fifth pads are connected to the chip pads of the driver integrated circuit.

6. The display apparatus of claim 1, wherein the first pads, the second pad, the third pad, the fourth pad, the fifth pad are arranged in a same driver integrated circuit area of the display panel.

7. The display apparatus of claim 1, wherein the second and fourth pads are disconnected from the first shorting bar after the test process of the first lines, and the third and fifth pads are disconnected from the second shorting bar after the test process of the first lines.

8. The display apparatus of claim 1, wherein the first pads are disconnected from the first shorting bar and the second shorting bar after the test process of the first lines.

9. The display apparatus of claim 1, wherein the first lines are gate lines, and the second lines are data lines.

10. The display apparatus of claim 1, wherein the second and fourth pads receive or transmit a vertical synchronization start signal, and the third and fifth pads receive or transmit a clock signal.

11. A method of testing a display apparatus comprising a display panel including a plurality of pixels a plurality of gate lines and a plurality of data lines, the method comprising:

applying a first test signal to a first shorting bar of the display panel, wherein the first shorting bar is provided between a second pad and a fourth pad of the display panel and connected to a first group of a plurality of first pads, which is connected to the gate lines, respectively;

applying a second test signal to a second shorting bar of the display panel, wherein the second shorting bar is provided between a third pad and a fifth pad of the display panel and connected to a second group of the first pads;

determining whether a defect occurs in the gate lines through a first probe pad electrically connected to the fourth pad and through a second probe pad electrically connected to the fifth pad; and electrically disconnecting the first and second shorting bars from the first to fifth pads, wherein the first and second shorting bars are arranged in a driver integrated circuit area of the display panel, in which a driver integrated circuit is to be disposed.

12. The method of claim 11, wherein the first to fifth pads are connected to chip pads in a gate driver integrated circuit which drives the gate lines.

13. The method of claim 12, wherein the second and fourth pads receive or transmit a vertical synchronization start signal, and the third and fifth pads receive or transmit a clock signal.

14. The method of claim 11, further comprising:

electrically disconnecting the first and second shorting bars from the first pads.

* * * * *